(12) United States Patent
Voser

(10) Patent No.: US 12,272,525 B2
(45) Date of Patent: Apr. 8, 2025

(54) SPUTTERING APPARATUS FOR COATING OF 3D-OBJECTS

(71) Applicant: EVATEC AG, Trübbach (CH)

(72) Inventor: Stephan Voser, Buchs SG (CH)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 18/554,754

(22) PCT Filed: Feb. 22, 2022

(86) PCT No.: PCT/EP2022/054308
§ 371 (c)(1),
(2) Date: Oct. 10, 2023

(87) PCT Pub. No.: WO2022/218592
PCT Pub. Date: Oct. 20, 2022

(65) Prior Publication Data
US 2024/0136156 A1     Apr. 25, 2024

(30) Foreign Application Priority Data

Apr. 16, 2021   (CH) ........................................ 400/21

(51) Int. Cl.
*H01J 37/32*   (2006.01)
*C23C 14/35*   (2006.01)
(Continued)

(52) U.S. Cl.
CPC ........ *H01J 37/32403* (2013.01); *C23C 14/35* (2013.01); *C23C 14/505* (2013.01);
(Continued)

(58) Field of Classification Search
None
See application file for complete search history.

(56) References Cited

U.S. PATENT DOCUMENTS

| 5,338,422 A | * | 8/1994 | Belkind | .............. | C23C 14/0036 |
| | | | | | 204/192.12 |
| 8,092,657 B2 | * | 1/2012 | De Bosscher | ...... | H01J 37/3435 |
| | | | | | 204/298.18 |

(Continued)

FOREIGN PATENT DOCUMENTS

| EP | 2306489 A1 | 4/2011 |
| JP | 2009108382 A | 5/2009 |

(Continued)

OTHER PUBLICATIONS

Haefer, Rene A., "Oberflächen-und Dünnschicht-Technologie, Teil I", Springerverlag 1987, Relevant Chapters are 7.3.10 for the multi-arc-technology and 7.4.1. (English translation of the respective highlighted paragraphs are enclosed).

(Continued)

*Primary Examiner* — Jason Berman
(74) *Attorney, Agent, or Firm* — McDonald Hopkins LLC

(57) ABSTRACT

An apparatus to coat at least one three-dimensional (3D) object. The apparatus includes: a coating chamber; a vacuum pump system; a chamber port; and a rotatable object holder. The holder has a rotational axis Z. At least two rotary cathodes are positioned in the chamber. Each cathode includes a hollow cylindrical rotary target having a rotary axis Y. A magnetic system is swivel or rotary mounted round axis Y and positioned neighboring to an inner diameter surface of the target. At least one power supply is provided for the target. The targets of the at least two rotary cathodes are positioned round the holder, with their axes Y1, Y2 transverse to axis Z, both being offset to the holder in a z-direction, and being offset to each other in a direction along axis Z on opposite sides of an object plane O which is vertical to axis Z.

21 Claims, 8 Drawing Sheets

(51) Int. Cl.
*C23C 14/50* (2006.01)
*H01J 37/34* (2006.01)

(52) U.S. Cl.
CPC .... *H01J 37/32568* (2013.01); *H01J 37/3408* (2013.01); *H01J 37/3417* (2013.01); *H01J 37/342* (2013.01); *H01J 37/3455* (2013.01); *H01J 2237/332* (2013.01)

(56) References Cited

U.S. PATENT DOCUMENTS

2009/0173621 A1* 7/2009 Kadlec ................ H01J 37/3408
　　　　　　　　　　　　　　　　　　　　　204/192.12
2011/0127157 A1* 6/2011 Bellido-Gonzalez ........................
　　　　　　　　　　　　　　　　　　　　　H01J 37/3405
　　　　　　　　　　　　　　　　　　　　　204/192.12
2020/0140992 A1* 5/2020 Schneider ......... H01J 37/32403

FOREIGN PATENT DOCUMENTS

| KR | 20090025473 A | 3/2009 |
| KR | 101246131 B1 | 3/2013 |

OTHER PUBLICATIONS

International Search Report and Written Opinion for PCT/EP2022/054308, dated May 19, 2022, 17 pages.

* cited by examiner

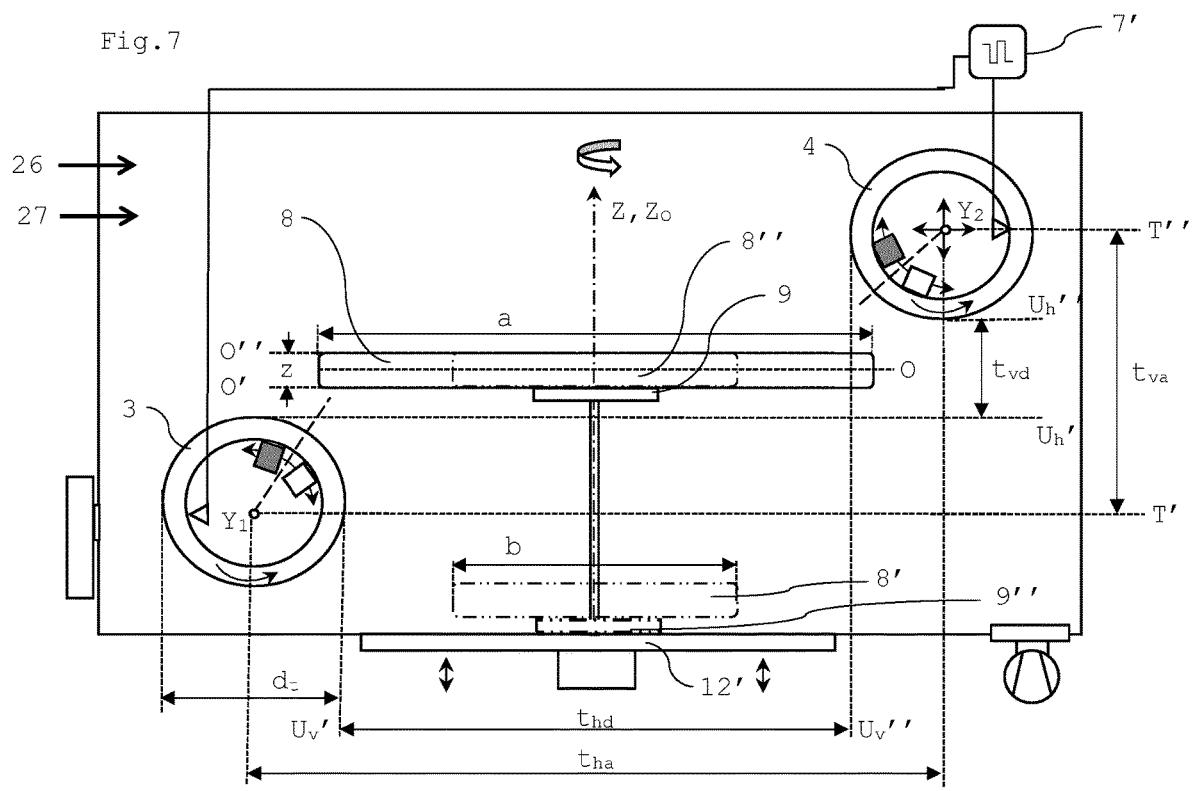

Fig.10A	Fig.10B	Fig.10C
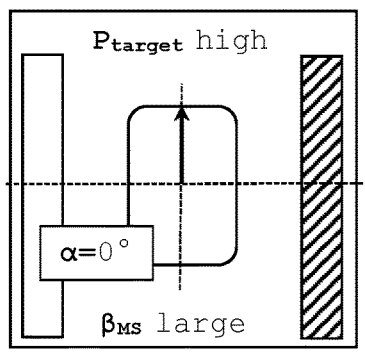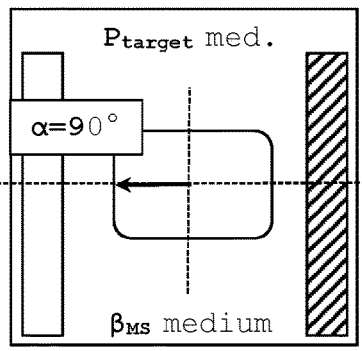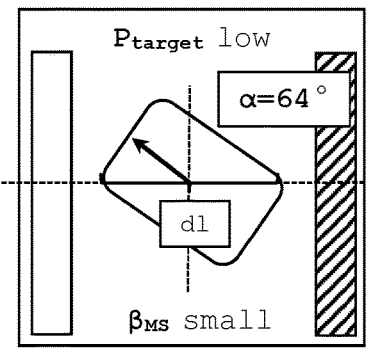
Fig.11
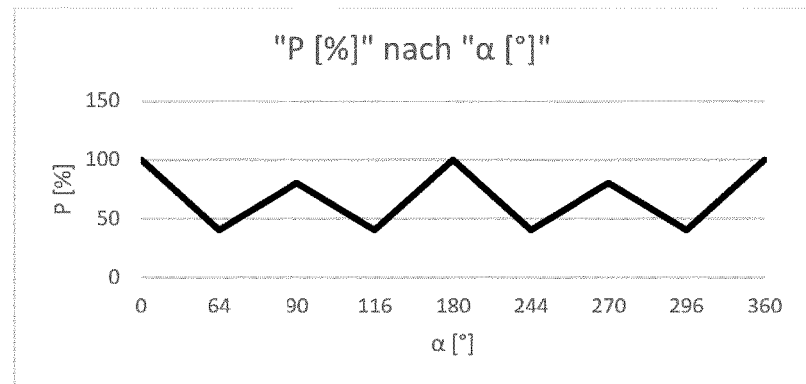
Fig.12
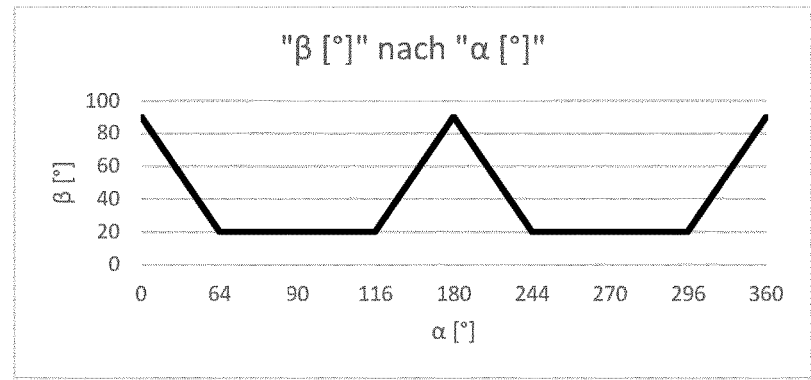

SPUTTERING APPARATUS FOR COATING OF 3D-OBJECTS

The invention refers to a PVD coating apparatus according to claim 1 and to a method to coat three-dimensional (3D) objects according to claim 14.

TECHNICAL BACKGROUND

Figure 1:
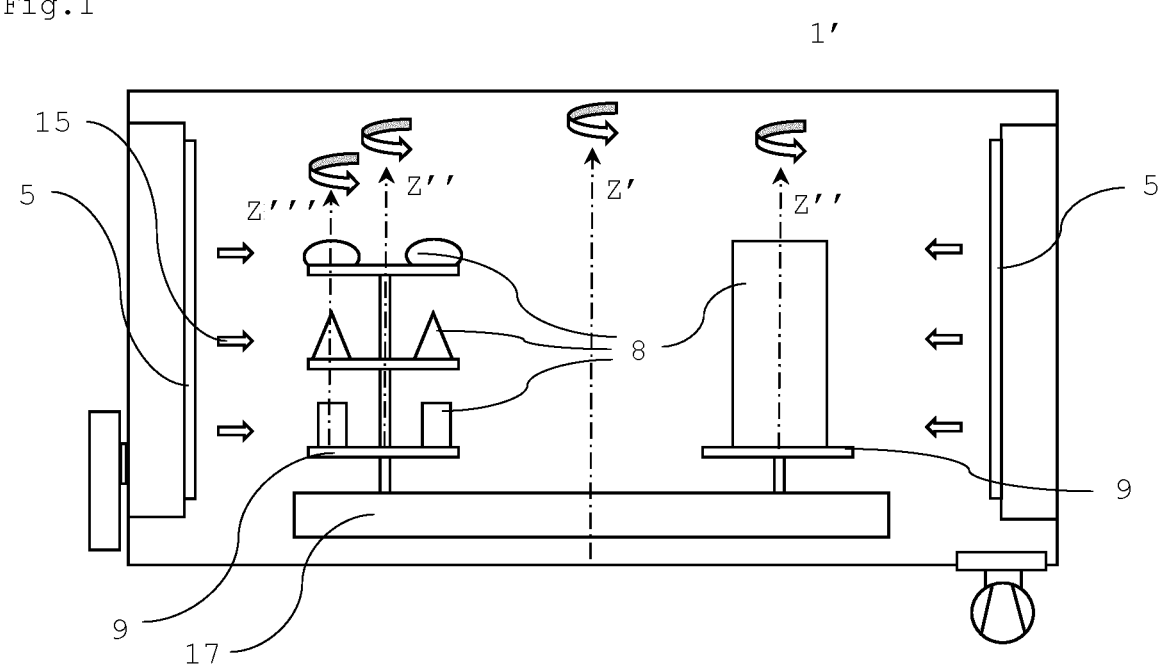

Coating of 3D-objects has a long tradition in sputter technology, due to the excellent properties of sputter-coated, e.g. hard coated surfaces which protect effectively tools from many kinds of wear, tools of very different dimensions are sputter coated since 1980 as disclosed in Oberflächen- and Dünnschicht-Technologie, Teil I, R. A. Haefer, Springerverlag 1987. However due to the highly decorative appearance of sputter coated surfaces such coatings have been used soon also in the watch and jewelry sector, and to a growing extent with any goods of daily use which comprises more and more electronic devices like portable loudspeakers, lap-tops, cellphones, watches and the like. Such tools or goods of daily life have been coated traditionally in big batch production units as shown in FIG. 1 where many 3D-objects 8, which could be even of different size and dimension, could be coated at the same time on object holders 9, rotating round axes Z'', which in there term were positioned on a so called carrousel 17, rotating round axes Z', meanwhile coating due to particle flow, as symbolized by arrows 15, from the targets 5 of the planar magnetron cathodes positioned round the carrousel and object holders took place. To improve thickness distribution on all surfaces even a third so called object rotation round axis Z''' can be applied. Additional inlets for reactive gases and further ionization equipment can be foreseen. Therewith a sufficient distribution could be reached for many applications and especially with tool applications the so called edge effect could be used as a benefit to apply a higher thickness at the edge where heavy abrasion takes place. Due to the higher electrical potential in the edge area ions are preferably accelerated and deposited in edge regions of a biased substrate whereby a higher deposition rate and a higher thickness at the top of e.g. cutting edges is produced.

Figure 2:
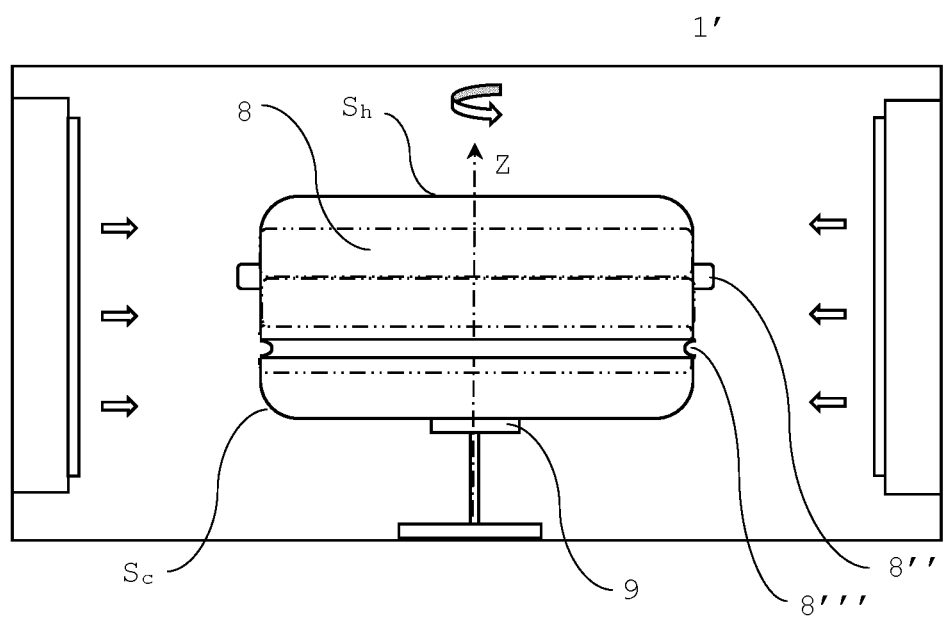

However, when utmost even coating distribution and properties should be produced over the whole surface of 3D-objects, such coating equipment comes to its limits. FIG. 2 therefore shows a more adequate arrangement to coat circumferential surfaces of single (solid line) or a staple (thin slash double-pointed lines) of prismatic or cylindric 3D-objects.

As can be easily seen from FIG. 2 distribution on top or bottom surfaces of a single 3D-object 8, there would be still a need for improvement, when it comes to the upper or lower surfaces $S_h$ and to the surface of the edge region, especially when convex, concave or other spherical shapes are used for the surface $S_c$ in the edge region of the 3D-object 8, or when the object has circumferential protrusions 8''' or recesses 8''''. The same would apply to objects being concave, convex or otherwise spherically shaped on the whole circumference.

Figure 3:
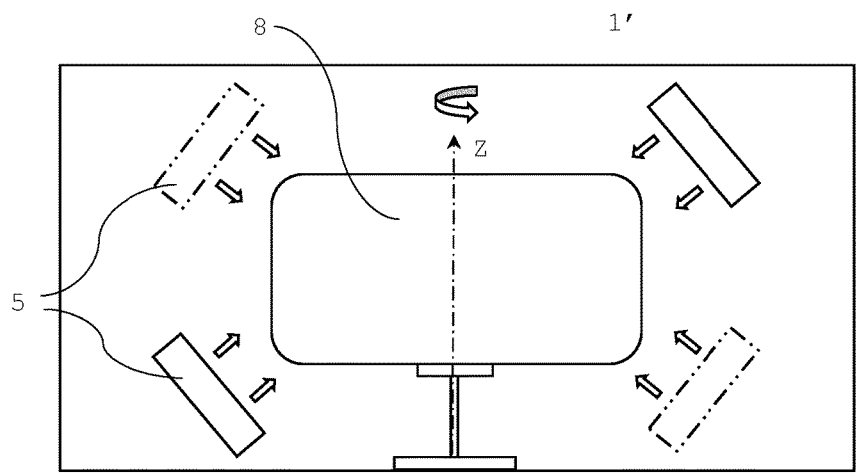

Therefore, many efforts have been made with further target arrangements and simulations as can be seen exemplarily in FIG. 3 where a different two and four (including thin slash double-pointed lines) target arrangement can be seen. Despite of a definitely better coverage of the upper and lower surfaces, the edge problem could not be solved and coating thickness variations were still in the range of at least 20% for cuboid objects.

Therefore, it is a target of the present invention to avoid the problems of prior art sputtering equipment as described above and provide a coating apparatus which allows to achieve a better distribution of coating properties like thickness, color, resistance against abrasion and the like with 3D-objects.

Definitions

X,y,z-coordinate system, and terms like upper, lower, top, bottom and the like are used and claimed in the present application in the common sense for the sake of simplicity and as a preferred embodiment. However alternative embodiments of the invention can be easily found by turning such coordinates in any angle, e.g. by 90°, if an inventive apparatus should be foreseen to have an chamber port at the side of the chamber, or by 180°, if an inventive apparatus should be foreseen to have an chamber port at the top of the chamber instead of the chamber port in the bottom as discussed with the present figures. Referring to the as mentioned examples respective rotation axis Z will thereby turn to a horizontal axis in case of a 90° turn, or just change the sign in case of a 180° turn, and upper respectively lower or bottom sidewalls will turn to opposite vertical side walls or change their position, and so will rotate all other key elements like cathodes with the targets and magnetic systems in relation to their positions to axis Z and the object holder. Therewith, whenever such terms are used or claimed, arrangements as mentioned above with respectively turned geometries are comprised and claimed.

A position angle β of the magnetic system defines the position of the so called sputter racetrack during a sputtering process towards the axis Z of the holder. The racetrack being the area where the plasma discharge takes place and the surface of the target is atomized by ion impact. With rotary targets the racetrack is usually formed as a straight linear area on the outer surface of the rotary target between the projection of two linear poles of opposite polarity which are swiveled by the magnetic system in parallel along the inner surface of the target. A position angle of β=0° here defines a race-track position whereby target material is sputtered essentially in parallel to axis Z, which means that the sputter cone is in parallel to axis Z. As an example, with a horizontal target axis Y and a vertical holder axis Z, the racetrack would be in an uppermost or a lowermost position of the target, depending whether the target is a "lower" or an "upper" target. A position angle of β=90° here defines a position of the racetrack which is nearest to holder axis Z, whereby a target material is sputtered essentially directly in an angle of 90° toward axis Z and the sputter cone is directed directly towards axis Z.

An object plane O, O', O'' is defined as a plane perpendicular to rotational axis Z and in a defined distance to the holder which moves together in z-direction with the holder. If used together O is positioned between O' and O''.

O can be positioned in or near the center of a circumferential edge, protrusion, or recess of a 3D-object. For flat objects, e.g. with a circumferential convex lateral surface, the object plane O may also define a central object plane, which is an x,y-plane, when positioned on the object holder. Flat means here that sides a and b or diameter d of the object, e.g. in an x,y-plane, are at least longer than 5 to 10 times side c in z-direction.

So called terminal object planes O', O'', e.g. on opposite sides of plane O, may be positioned where a circumferential edge, protrusion, or recess ends either on the lateral surface of the object, or on the terminal surface of the object itself.

SUMMARY OF THE INVENTION

Surprisingly it has been found that disadvantages of the state of the art as mentioned above could be avoided and a better coating uniformity for three dimensional (3D) objects could be achieved with an inventive apparatus comprising in a basic embodiment:
- a coating chamber;
- a vacuum pump system connected to the chamber by a vacuum port;
- a chamber port to transfer the 3D-object(s) into the chamber;
- a rotatable object holder, the holder having a rotational axis Z and holds and rotates the 3D-object(s) to be coated during a deposition process;
- at least two rotary cathodes positioned in the chamber, the cathodes each comprising a hollow cylindrical rotary target having a rotary axis Y;
- a magnetic system, e.g. in magnetron configuration, which is separately from the target rotation swivel or rotary mounted round axis Y and positioned neighboring to an inner diameter surface of the target;
- at least one power supply for the target;

whereat the targets of the at least two rotary cathodes are positioned in top view projection round the holder along axis Z, with their axes $Y_1$, $Y_2$ transverse to axis Z, and being offset to the holder and to each other in a direction along axis Z, at least with the axes $Y_1$, $Y_2$ of the targets on opposite sides of an object plane O which is vertical to axis Z. In most cases both targets will be on opposite sides of the object plane as a whole, with a vertical distance from object plane O, which can be equal for objects being symmetric with reference to the object plane O, or being different with respective asymmetric 3D-objects. Outer target diameters and therewith axes $Y_1$, $Y_2$ will be usually aligned tangentially to concentric cylinders having common axis Z. The cylinder touching the outer target diameters directed towards axis Z has a diameter D.

In a preferred embodiment, axes $Y_1$, $Y_2$ of the targets are positioned in a right angle to axis Z.

In a further preferred embodiment axes $Y_1$, $Y_2$ of the targets are both horizontal, e.g. in respective horizontal target planes, and offset to each other on opposite sides of a plane O. Plane O is an essentially horizontal object plane. It can be a central object plane with reference to the height of thin objects, or a plane in an area where the diameter of the object varies in a z-directions, or a respective asymmetry of the object, as explained under definitions and further below.

In an embodiment of the invention, the object holder can be mounted on the closure of the chamber port, e.g. on an inner surface of the closure.

The chamber port can be placed in a bottom area of the chamber, e.g. in a center of the bottom area.

Alternatively, a position on a sidewall or in the head area of the chamber.

Preferably the holder is movable along axis Z, in a vertical direction to position or center the object(s), e.g. with reference to its height between the targets, or at least between target axes $Y_1$, $Y_2$, if the object dimensions should overlap with an outer region of the target diameter in side view projection. Moving and positioning of the holder in a z-direction can be performed by a holder lifter 20 which can be a spindle jack, a hydraulic lift, or a pneumatic lift as an example.

The apparatus in another embodiment may further comprise at least one further rotary cathode, positioned above or below the at least two rotary cathodes. Thereby the further rotary cathode can be mounted in parallel to axis Z or again with its axis $Y_f$ transverse, especially in a further horizontal target plane. Thereby the further target should be mounted with axis $Y_f$ above or below final object planes O' or O" and diameter overlapping or in a near distance, e.g. from 0 to 50 mm below or above respective object planes O' or O".

Alternatively instead of a further rotary cathode or in combination, at least one planar magnetron, positioned above or below the at least two rotary cathodes can mounted. Which can be useful, e.g. for elongated substrates having long even cylindric or near cylindric side surfaces like regular prismatic objects having at least 4 or 5 edges and similar or equilateral side dimensions in top view projection.

In a further embodiment the apparatus may comprise a number of 2n targets whereat n is an integer, which can be between 1 and 4 or 5. As an example for n=1 the two offset targets can be positioned on the same side or alternatively on opposite sides of the holder, with reference to axis Z. For n=2, the two offset targets can be arranged also with axis $Y_1$, $Y_2$ vertical to each other and to the next target of the other offset target pair when seen in top view. With n=3, a 60° angle can be used with both targets at the same side or on opposite sides and so forth.

At last one target on one side of plane O and at last one target on the other side of plane O may each have a separate power supply.

In an alternative embodiment the one target on one side of plane O and one target in closest position on the other side of plane O can be connected to a bipolar power supply in dual magnetron configuration. Thereby the target pair can acts alternatingly as cathode and anode. Therewith n-target pairs can be driven with n bipolar power supplies.

In a further embodiment the apparatus may comprise a control system with a power modulator adapted to set and control the power of the at least one power supply and a magnet controller adapted to set and control movement and position of the magnetic system. Power modulator and magnet controller can be dedicated sub-control systems or can be realized within one central control system programmed to realize respective functions.

With any embodiment as described above, an alignment mechanism for the targets, respectively the rotary cathodes is helpful if the apparatus should be designed in a flexible manner to coat objects of different size and/or shape. In a most simple way the alignment mechanism may comprise a linear mechanism to move the respective rotary target, which should be aligned in the target plane T', T" tangentially to concentric cylinder D, towards and away from axis Z. Movement of 2n or more targets can be synchronized. The linear mechanism may comprise in its most simple embodiment in its most simple adjustment screws, or if frequent alignment to largely different object dimensions should be necessary, a spindle drive, or a pneumatic/hydraulic drive. The linear mechanism will usually be operatively connected to the cathode which forms an operational unit with the target.

For an apparatus designed to coat flat objects only to be positioned between the upper and lower target(s) and overlapping with an outer diameter area of the target(s) in a top view projection, a respective drive for the lower target(s) may suffice to lift the objects in coating position by the holder lifter.

Despite of the fact that positioning of the 3D-objects in z-direction can be performed by the holder lifter via respective holder movement, as described above, it might be useful to provide a further alignment mechanism affecting a movement in z-direction to at least the upper target(s) to adjust the target configuration for different object dimensions also in a z-direction. Therefore, the alignment mechanism for the targets may be complemented again with adjustment screws up/down in z-direction or with a mechanical drive effecting the z-movement of at least the upper cathode-target unit. Such screws or a further drive can be included in the alignment mechanism effecting the movement in the target plane or can be realized separately. Again, the drive can be a simple linear drive, as mentioned above with the holder lifter. For high positioning or alignment accuracy of the object(s) respectively the target(s) a linear actuator system can be used as holder lifter and/or alignment mechanism.

In an embodiment of the invention, which may be combined with any other of the embodiments of the inventive apparatus an object axis Zo of the at least one 3D-object corresponds to the holder axis Z, which means that both axis coincide when the 3D-object is mounted. Therewith the object holder is configured to hold the at least one 3D-object aligned centrally, i.e. centered, on axis Z, when a 3D-object is mounted. Therefore, the object holder may comprise means to center the at least one 3D-object on axis Z. Centering her refers to the geometric proportions of the 3D-object which may but need not necessarily be the center of gravity. As an example, flat 3D-objects like discs or flat cuboids may be mounted with their vertical axes Zo aligned with axis Z of the holder. Similar refers to cylindric or respective elongated bodies which can be again mounted with their vertical axes Zo aligned with rotational axis Z, which in both cases means the 3D-object rotates round its own axis. The means to center the body on the holder may be known means as for example screws, positioning recesses or positioning nips for all types of holders, e.g. pedestal or table like holders, and spreader mechanisms, e.g. like spreader clamps, to fix a hollow 3D-body on a physical holder axis in Z-Position.

A further task of the invention is to provide a process to deposit a coating on a surface $S_c$, $S_h$, $S_v$ of at least one 3D-object using an embodiment of an apparatus comprising a control system as discussed above. Where $S_c$ stands for an essentially convex or concave surface, e.g. on an edge, a protrusion or in an recess, especially of a respective sidewise circumferential structure of the 3d-object; and $S_h$ stands for an essentially horizontal surface, e.g. on the terminal upper and lower side, and $S_v$ stands for an essentially vertical side, e.g. an outer cylinder surface of a 3D-object. The process comprises the following steps:
 mounting the at least one 3D-object on the holder;
 Transferring the holder with the 3D-object into the coating chamber;
 applying vacuum to the chamber by opening the vacuum port;
 setting a gas flow of inert gas and setting optionally a gas flow of a reactive gas;
 optionally applying a substrate bias to the 3D-object;
 connecting the targets to a power supply to sputter material from the targets towards the surface.

Thereby the target power P of at least one of the targets may be synchronized by the power modulator with at least one of the following process features:
 a rotation angle α of the holder round axis Z;
 a position angle β of the magnetic system;
 a swivel frequency f of the magnetic system;
 an angular velocity ω of the magnetic system.

Thereby preferably with a position angle β of the magnetic system and/or, at least for rather different horizontal dimensions a, b of a 3D-object, e.g. a cuboid with a rectangular base, with a rotation angle α of the holder round axis Z.

Alternatively, or in combination with the power modulation above, the magnetic systems of the targets can be swivel mounted, and the magnet controller controls the position angle β or/and a swivel frequency f of each of the magnetic systems in dependency of a number m of holder turns round axis Z, where m is an integer. Or in other words the controller initiates to change position angle β or swivel frequency f after a certain number m of turns, e.g. to set the angular position β of the magnetic systems of the targets to another, a same or a different absolute value |β| for the targets, in dependency of the shape of an object mounted on the holder. Setting the angular position β may comprise setting an absolute static position $β_x$ or setting a swivel range between a value $β_{x1}$ and value $β_{x2}$.

In a further process embodiment alternatively or in combination with the power modulation above magnetic systems of the targets are swivel mounted, and the magnet controller controls the position angle β or/and a swivel frequency f of each of the magnetic systems (6, 6') in dependency of a rotation angle α of the holder round axis Z. This process variation is adapted rather for slow holder rotation R, e.g. R<0.5 or 0.2 r/s (i.e. rounds per second) and makes it possible to follow a certain circumferential surface of an object being rotated on the holder, which may be a protrusion, a recess, or any other surface area between, with the center of the sputter cone or avoid to do so. Position angle β or/and swivel frequency f can be set or varied together or individually depending of the shape of an object being rotated on the holder. Such a process can be easily applied for cylinders or regular equilateral prisms with at least 5 or 6 edges due to only minor substrate to target distance differences.

With swivel mounted magnetic systems the position angle β of the magnetic system can set in a range from ±0° towards plane O to ±90° towards axis Z. The term "±" is used in a vectorial sense, meaning with reference to the figures up or down for 0° and right or left with reference to 90°, aspects as mentioned in the definitions above can be applied for alternative embodiments. A smaller angle range can be applied according to the respective shape and dimension of the 3D-object, e.g. with flat objects.

In a further process embodiment, alternatively or in combination with the power modulation above, the magnetic systems are rotary mounted, and the magnet controller controls an angular velocity ω of the magnetic system in dependency of a number m of turns of the holder, where m is an integer, or as a further alternative in dependency of a rotation angle α of the holder round axis Z. For the latter the same refers as mentioned above.

In a further embodiment, the object to be coated has a long Z-Axis and is of a cylindric, of a prismatic, or of a cuboid shape. Long is hereby defined by a height of at least 1.5 or at least 2 times the length of a cylinder diameter or a respective multiple of a perimeter of a prismatic body, as mentioned above.

In a further embodiment, the object to be coated is a flat body having two horizontal axes A, B of essentially different length in a relation of 10/12 to 10/40, and a thickness in a relation of 1 to 150 to one of horizontal axes A, B.

Thereby 3D-objects having very different geometric dimensions can be coated uniformly, e.g. with z<<b<a, e.g. in a relation of 1/10/20.

In a further embodiment, a process to deposit a coating on a surface ($S_c$, $S_h$, $S_v$) of at least one 3D-object comprising the following steps:

Providing an inventive apparatus comprising:
- a coating chamber;
- a vacuum pump system connected to the chamber by a vacuum port;
- a chamber port;
- a rotatable object holder, the holder having a rotational axis Z;
- at least one rotary cathode positioned in the chamber, the cathode comprising a hollow cylindrical rotary target having a rotary axis Y;
- a magnetic system (6, 6') which is swivel or rotary mounted round axis Y and positioned neighboring to an inner diameter surface of the target;
- a power supply (7,7') for the target;
- whereat the target of the rotary cathode is positioned with axis $Y_1$, $Y_2$ in a target plane T', T", the target plane being perpendicular to axis Z, and the rotary cathode(s) being positioned in a distance D from axis Z; Thereby the target may be aligned tangentially to a concentric cylinder D of diameter D having axis Z as a center of its diameter and encompassing, touching or slightly overlapping the largest holder or substrate dimensions in a top view projection; Thereby the target(s) can be aligned concentric in the middle of the target to cylinder D.

mounting the at least one 3D-object on a rotatable holder;
transferring the holder with the 3D-object into the coating chamber; and
position at least one object plane O, O', O" comprising an essentially circumferential edge, protrusion or recess in a distance to a target plane T', T" to allow sputtering in an angle $\beta_E$ to the edge, protrusion or recess whereat angle $\beta_E$ can be in a range of $\beta_E=45°\pm30°$, respectively $\pm20°$;
applying vacuum to the chamber by opening the vacuum port;
setting a gas flow of an inert gas and setting optionally a gas flow of a reactive gas;
optionally applying a substrate bias to the 3D-object;
rotate the 3D-object;
connecting the targets to a power supply to sputter material from the targets towards the surface of the object;
swivel or rotate the magnetic system to sweep over or position a center of a sputter cone in an angle $\beta_x$ from 0° to 90° or smaller.

It should be mentioned that two or more embodiments of the apparatus according to the invention may be combined unless being in contradiction.

It should be further mentioned that all features as shown or discussed in connection with only one of the embodiments of the present invention and not further discussed with other embodiments can be seen to be features well adapted to improve the performance of other embodiments of the present invention too, as long such a combination cannot be immediately recognized as being prima facie inexpedient for the man of art. Therefore, with the exception as mentioned above all combinations of features of certain embodiments can be combined with other embodiments where such features are not mentioned explicitly.

FIGURES

Figure 4:
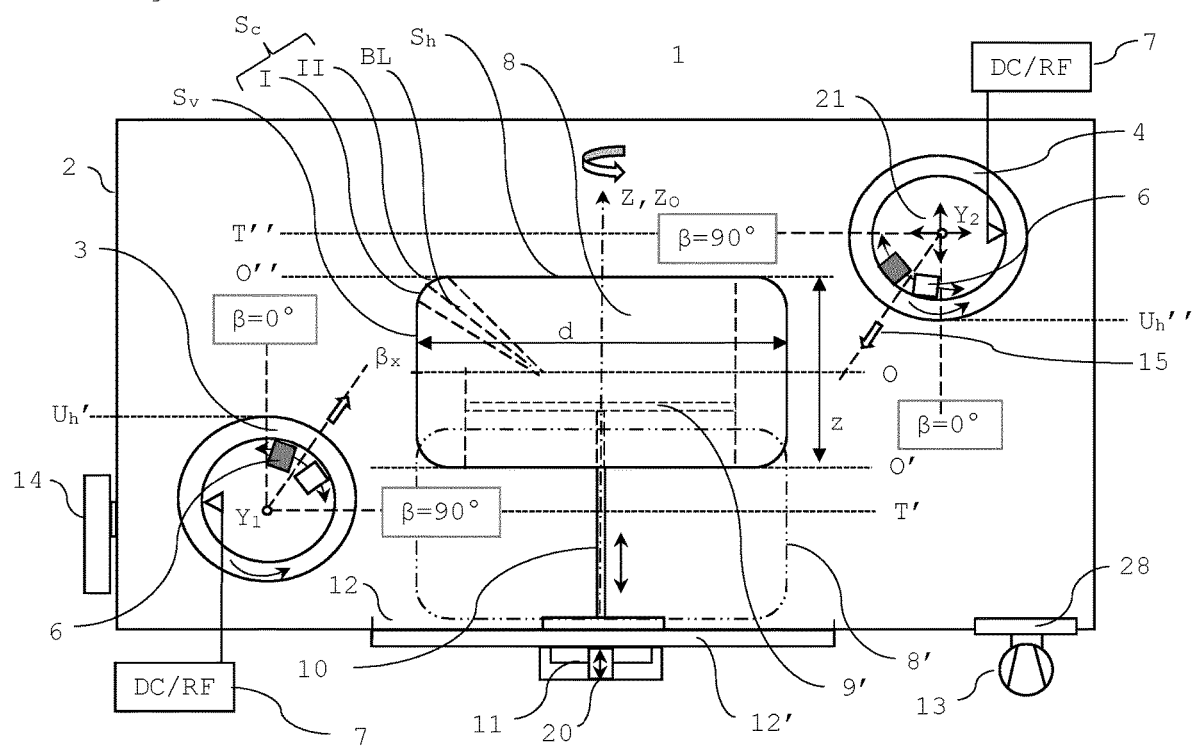
Figure 5:
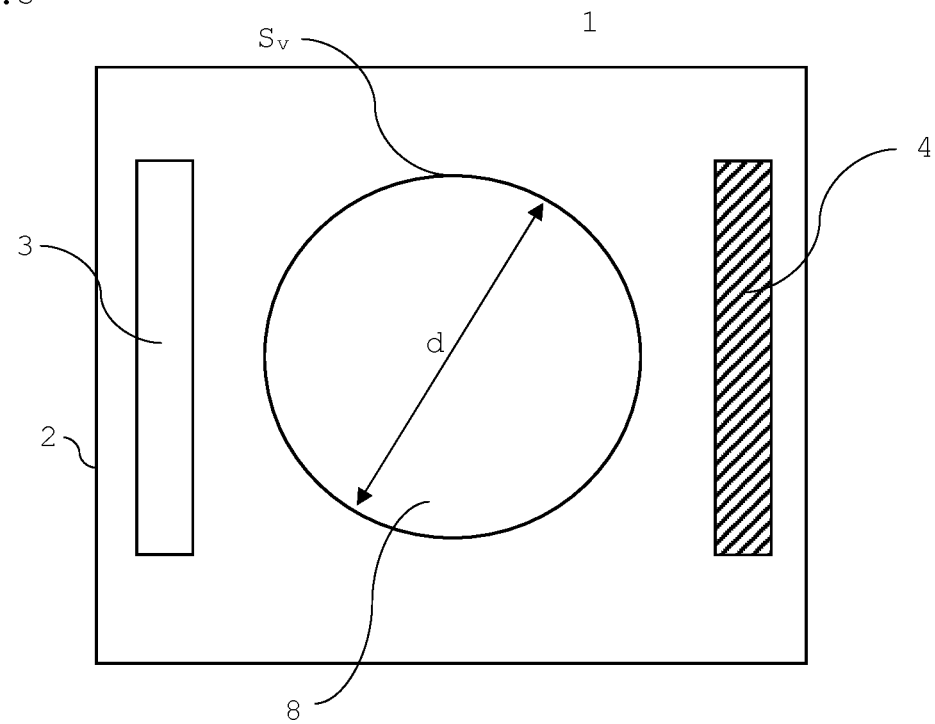
Figure 6:
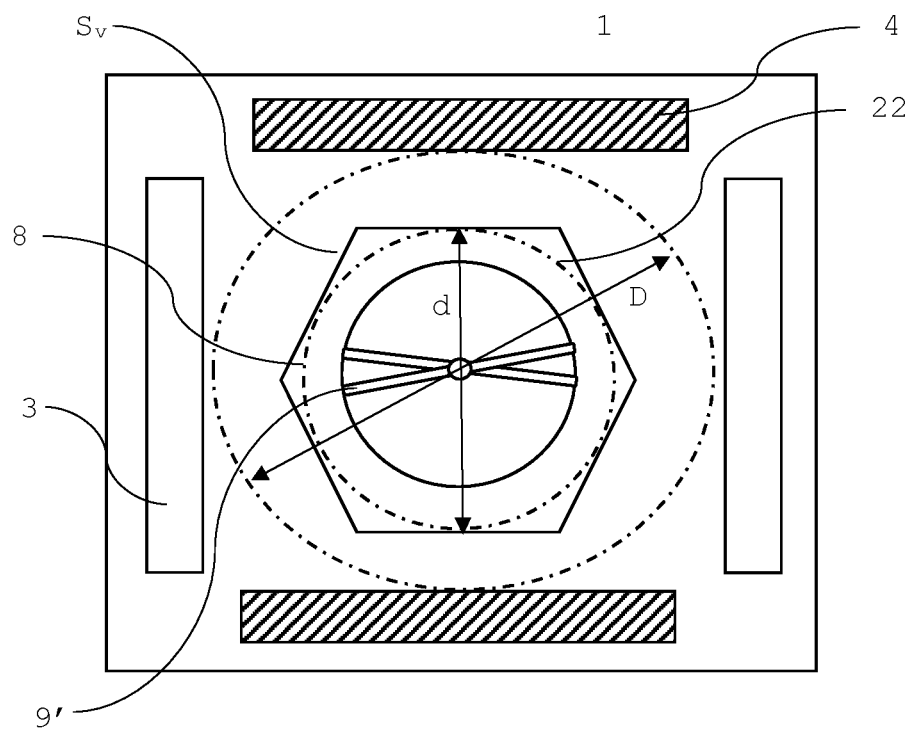
Figure 8A:
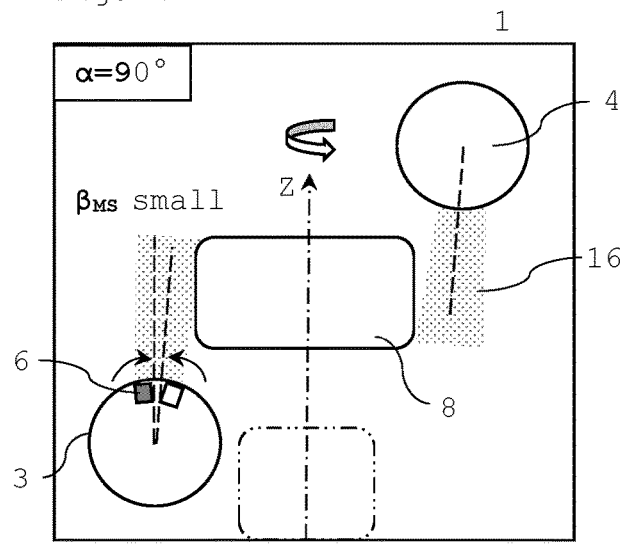
Figure 9A:
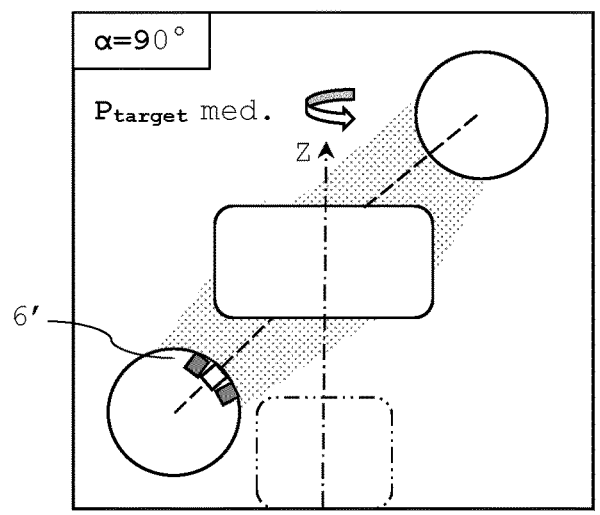

The invention shall now be further exemplified with the help of figures. It should be mentioned that figures are not reproduced to scale and give a schematically view only of important aspects of the invention. Same reference numbers or signs refer to the same matter. Inverted commas and subscript numbers or signs refer to subspecies or subfeatures of the respective feature without such superscript or subscript indications. The figures show:

FIG. 1: An apparatus of the state of the art;
FIG. 2: A further apparatus of the state of the art;
FIG. 3: A further apparatus of the state of the art;
FIG. 4: A vertical section of an inventive apparatus;
FIG. 5: A horizontal section of an inventive apparatus;
FIG. 6: A horizontal section of an inventive apparatus;
FIG. 7: A further vertical section of the apparatus of FIG. 4;
FIG. 8A, B: Movement scheme of the magnetic system, vertical section;
FIG. 9A, B: Scheme of power modulation, vertical section;
FIG. 10A, B, C: Scheme of magnetic movement and power modulation, horizontal section;
FIG. 11: Graph of power modulation;
FIG. 12: Graph of position/angle modulation of the magnetic system;
FIG. 13-15B: Further embodiment of inventive apparatuses;
FIG. 16: Detail of an inventive arrangement.

With reference to FIG. 1 to 4 it is referred to the section technical background above.

In FIG. 4 a vertical section of a first embodiment of an inventive apparatus is shown. The coating apparatus 1 comprises a vacuum coating chamber 2 with vacuum pump 13 and control system 14 attached. The object 8 can be a solid object surrounded by closed surfaces in continuous lines or alternatively can be a hollow object, e.g. a type of tube or a polygonal frame and fixed with a holder 9' in an inner circumference of the object as shown in dashed lines. The frame can be a covered one-piece frame, may have a separate cover or is open on both ends.

The targets 3,4 of two rotary cathodes are placed on two opposite sides of the object holder 9' in respective distance to the surfaces of object 8 to be coated. Targets 3,4 are supplied by separate target supplies 7, which can be DC, pulsed DC, RF, high plasma ionization magnetron sputtering (HIPIMS), or mixed supplies, e.g. when DC and RF frequencies, or two RF frequencies of different frequency are superimposed. When RF, HIPIMS, or mixed supplies are used, synchronizing means will be applied to avoid harmful frequency interferences. Supply lines 7''' deliver the power from the target supplies to an inner surface of the targets via dynamic pick ups. A substrate bias supply 19 can be optionally foreseen to bias the object with DC, DC-pulse or RF-frequencies which may be synchronized with the respective frequencies of the target supplies.

With the embodiment as shown, the holder is mounted on a closure 12' of the chamber port 12 in the bottom of the chamber 2. On the outer side of the chamber port an object drive 11 is mounted to rotate the object holder 9' with the object(s) during the deposition process and optionally for positioning. The vertical object axis Zo is aligned with rotation axis Z of the holder.

Within the hollow target tubes 3, 4, which are rotated during sputtering, a magnetic system 6 comprising at least two rows of permanent magnets of opposite polarity (black and white) is swivel mounted, so that during sputtering the so called racetrack which is formed between the two rows of magnets on the outer surface of the target can be varied from an angle $\beta_x=0°$ in direction of horizontal plane O to an angle $\beta_x=90°$ in direction of the rotation axis Z. Smaller angles from 20° to 70° may be applied for different object geometries up to the respective needs. Further details of the rotary cathodes like cooling cylinders for the inner surface of the target, details of the swivel system and drive, target drive, dark room shields and the like should be in place, but are not shown as being known state of the art and not relevant for the present invention. The same refers to gas inlets for inert sputter gas and/or reactive gas, process monitoring devices or means to enhance ionization of the sputtered particles, which may help to enhance respective thickness distribution too, however, are not a subject of the present invention. Targets 3 and 4 are arranged offset in relation to each other with reference to a Z-direction, defined by rotation axis Z of the holder 9' whereby objects 8 can be positioned by holder 9' with reference to plane O, which defines a middle, here horizontal plane between lower and upper target axes $Y_1$, $Y_2$ respectively between target position U' and U". Where U' is the uppermost outer diameter position of the lower target 3 and U" is the lowest outer diameter position of the upper target 4. The holder 9' can be rotated for deposition by holder drive 10 and be moved along axis Z by holder lifter 20 which acts on telescopic post 10 to move the holder respectively.

Furthermore, devices to promote ionization of the sputtered atoms, or heating and/or cooling devices, or etching devices (not shown) can be foreseen within the chamber, e.g. if the sputter deposition process should comprise also conditioning steps like degassing, etching, heating, and/or cooling, in front or behind the sputter deposition step within the same chamber. However, as a bottom loading sputter chamber as shown can be mounted, e.g. above an object handling level of a multi-chamber processing system, which comprises further processing modules, features relevant to sputtering and uniformity of the deposited coatings are in the focus of the further explanations.

FIG. 5 shows a scheme of a horizontal section of an inventive apparatus as shown in FIG. 4, with the upper target 4 having a stripped pattern and the object has a cylindrical shape.

Similarly, FIG. 6 shows a horizontal section, however this section comprises four rotating targets arranged in the chamber 2 regularly arranged round a hollow object 8 which has the shape of a regular equilateral hexagon. Two targets are positioned above and two targets are positioned below object plane O, on different sides but in equal distance to S. Therewith a faster deposition rate can be attained than with the two cathode arrangement in FIG. 4 an 5. Similar target arrangements with 6 or any further 2n target arrangement, with n being an integer 1, can be build for 3D-objects with respective big diameters in coating chambers of respective big dimensions, whereby upper and lower targets can be arranged alternatively round the holder, respectively object perimeter. Furthermore FIG. 6 shows a central cylinder of diameter D in tangential touch with the outer target diameters. In this case diameter D encompasses perimeter and inner diameter of hexagonal prisme 8 in a distance, which is a good option to attain a very uniform coating also on the sidewall surfaces for elongated 3D-objects.

With a configuration as shown in FIGS. 4 to 6 angel $\beta_x$ of the magnetic system can be varied between 0° and 90° or in a smaller opening angle to sweep over all surfaces of the 3D-object to be coated. The surface of the 3D-object comprises side surfaces $S_v$, in parallel to axis Z, surfaces $S_h$ in an angle to axis Z, here in parallel and in planes O' or O", and convex surfaces $S_c$ in a transition area between surface $S_v$ and $S_h$. Angular velocity of the swiveling magnetic system can be varied to optimize respective deposition variance to a minimum for all object surfaces as mentioned above.

Alternatively, instead of sweeping through the complete angle sector between 0 and 90°, the magnetic system may be stepwise positioned in different angular positions which may be in the case of FIG. 4 30°, 45°, 70° and 85° degree. At each position sputtering is performed during at least one or a multitude of 360° rotations of the 3D-object, while sputterpower can be varied according to the geometric diameter of the respective substrate plane Oz to which the center of the sputter cone is directed.

As an example, for coating of short cylindric, or prismatic objects having a relatively short dimension z and surface $S_v$, compared to a relatively big dimension d and surface $S_h$ of a diameter of the cylinder (as shown in FIGS. 4 and 5), or of an inscribed diameter of a regular equilateral prism (as shown in FIG. 6 with a hexagon base), dwell time of the magnetic system within an angle area for $\beta_x$ between 0° and about 45° can be chosen to be shorter than dwell time in an angle area for $\beta_x$ between about 45° and 90° depending on the positioning of the target axes $Y_1$, $Y_2$ towards the respective edge of the 3D object, see also following paragraphs. On the other hand, in case of elongated 3D objects having a relatively long dimension z and respectively long or high surface $S_v$ and a relatively small dimension d and surface $S_h$ f respective dwell times can be inversed. In other words coating times, here dwell times $t_v$, $t_h$ and power intensities $P_v$, $P_h$ of the target supplies can be chosen proportional to the respective geometric surface proportions $S_v$, $S_h$ of the 3D object(s), e.g.

$$(t_v \times P_v)/(t_h \times P_h) = k \times \Sigma(S_v)/Z(S_h)$$

where k is a constant which would be 2 in case of a cubic object or in case of a cylinder of equal height and diameter. As above, sputter dwell time can be the time a certain surface area is exposed to the sweeping sputter cone or the number of object rotations the respective surface is exposed to a sputter cone of a temporarily stationary sputter cone.

Therewith angular velocity ω of the magnetic system, which is in inverse ratio to the dwell time and defines respective angle $\beta_x$ of the position of the racetrack and resulting sputter cone, as well as step by step positioning can be used to define and optimize the coating thickness as well as other coating parameters separately for respective surfaces $S_h$, $S_v$. With reference to surface $S_c$, in case of FIGS. 4 to 6, a convex surface at the edge of the 3D object, special measurements can be taken and angular velocity can be set to a value $\omega_n$, which can be e.g. between the higher angular velocity $\omega_2$ used for the coating of the smaller object sides in an average distance from the target which is closer to the active target surface (the race track), here sidewalls with dimensions z, and a lower angular velocity col set for the object dimension d in an average distance from the target which is further away from the active target surface, here the surfaces in plane O' or S", or upper and lower surfaces.

As mentioned above the same effect can be produced by stopping the magnetic system in defined angular positions to perform sputtering for at least one 360° turn of the object holder. Varying distances between the racetrack on the target surface and the object surface in the respective object plane $O_x$ which arise due to deviations from a cylindric shape at or near the respective object plane can then be compensated by power modulations, e.g. applying a lower power for surfaces passing the race track in a closer distance and applying a higher power for surfaces passing the racetrack in distance further away, see also FIG. 10A to B.

As an example for cylindric objects, targets can be aligned with an alignment mechanism 21 symbolized by a pair of x/z double arrows (only shown with axis $Y_2$) so that the magnetic systems can be positioned, e.g. in such a way, that $\beta_x$ is in line with the angle bisector line BL, which divides surface edge section $S_c$ in two subsectors I, II, when the sputter cone of targets 3, respectively 4 is directed towards the respective circumferential edge of the 3D object. In case of the cylinder in FIGS. 4 and 5 as shown, as well as with the hexagonal prism in FIG. 6, or any prism or cuboid of similar basis dimensions a and b the angle bisector line is 45° and so is $\beta_x$ when opposed to the center of the convex edge. Similar hereby means with the example of a rectangular base with sides a, b (in an x,y-plane): a/b<1.5 and b a. The angular velocity con can be set to a constant value between $\omega_1$ and cot for the time when it sweeps across the convex area or be shifted, e.g. continuously between $\omega_1$ and $\omega_2$. In case of a continuously shifting con a slightly higher target power might be applied for the sector where average angular velocity $\omega$ is higher to achieve the same thickness in both sectors so that $\tilde{\omega}_I/P_I = \tilde{\omega}_{II}/P_{II}$.

In case of similar surface and geometric relations, as with cubes, or cuboids of similar side dimension, cylinders of similar height and diameter or regular prisms of similar height and lateral dimensions a constant power P can be used to sweep continuously or stepwise over the vertical respectively horizontal surfaces of the 3D object during the coating process.

FIG. 7 shows a further vertical section of an apparatus according to FIG. 4, having mounted a flat cuboid substrate of dimensions a, b in the x,y-plane and c in z-direction, whereby a/b≥1.5, to demonstrate the benefit of the inventive apparatus with reference to coating processes for 3D-objects having very different geometric dimensions, here c<<b<a, e.g. in a relation 1/10/20.

In a further embodiment of the invention a flat 3D-object 8 can be positioned and rotated in a central object plane O overlapping with the targets in a Z-projection as shown in in FIG. 7. This means that the longer horizontal object side of dimension a is longer than the horizontal distance $t_{hd}$ between inner diameter positions $U_v'$ and $U_v''$ of the offset (lower and upper) targets 3, 4. However at the same time targets 3, 4 should be aligned symmetrically in target planes T', T" by alignment mechanism 21, such that the mounted 3D-object does not overlap in Z-projection with target axes $Y_1$, $Y_2$, even when it is rotated by the holder so that its maximum dimension are positioned between the axes, e.g in a "diagonal" position as shown in the horizontal section of FIG. 10c. To allow an optimal thickness distribution on side surfaces $S_v$ even in edge areas neighbouring the racetrack in such a so called "maximum positions" of the 3D-object (e.g. with diagonal edges in front of the targets as in FIG. 10C), a projected distance of at least 25 to 100 mm between axes $Y_1$, $Y_2$ and the outermost edge of the object should be maintained. That is for a diagonal dimension d1 as present $d1=(a^2+b^2)^{1/2}$ and $(t_{ha}-d1)/2 \geq 5$ or 5≥30 mm. The actual minimum distance depends on the size of the target diameter $d_t$ and the dimension z of the body 8 to be coated, as it should be avoided that side surfaces $S_v$, which can be in parallel to axis Z or at least in part convex as shown, can be coated only by a grazing particle beam of the sputter cone 16, in parallel to surface $S_v$ to be coated. It should be mentioned that even a sputter cone of a magnetic system 6 in $\beta=0°$ position, that is in parallel to Z-direction and a respective planar surface $S_v$ can coat a respective surface by sputtered particles flying in an angle to $\beta$. Such effects can be enforced by already known processes using additional ionization of the sputtered particles, e.g. HIPIMS-processes, and the application of a substrate bias.

To introduce and position the 3D-object into the coating chamber 2 it is first put on the object holder with its long horizontal side a in parallel to target axes $Y_1$, $Y_2$ and the chamber port 12 closed in the following, double arrows here showing movement directions of the closure 12'. In this position object 8' and substrate holder 9" are shown in dashed double dotted lines at the bottom of the chamber. Thereafter the holder lifts the object along axis Z into a respective parallel position in the object plane O as shown with reference numbers 8"' for the object and 9 for the holder. The vertical object axis Zo is aligned with rotation axis Z of the holder. Only than rotation can be initiated to bring the object into different coating positions whereat $\alpha=0$ in a parallel position as shown in dash-dotted lines, whereas reference number 8 here shows the substrate in solid lines in an $\alpha=90°$ position, see also FIG. 10A-C.

To align the sputter cathodes and thereby targets 3, 4 also in a vertical direction to 3D-objects of different dimension z at least the upper electrode 4 can be moved also in a Z-direction as symbolized by the vertical double arrows of the alignment mechanism 21 for target axis $Y_2$.

In FIG. 7 the power supply is a bipolar pulsed power supply 7' being configured as a dual magnetron supply, thereby connecting electrically outputs of different polarity with the inputs of targets 3 and 4, which during sputtering act alternatingly as cathode and anode. Despite of the fact that separate power supplies could be used also with the configuration in FIG. 7, a bipolar configuration has benefits when reactive gases are used which otherwise might tend to poison certain target surfaces. Poisoning here means to make the target surface electrically isolating by chemical reaction with the reactive gas. Therefore, respective dual magnetron configurations using a bipolar pulsed power supply 7 might be used for any embodiment when respective reactive gases like oxygen or nitrogen should be used. Such reactive gases can be supplied by a separate reactive gas inlet 27 or together with the sputter gas via obligatory inert gas inlet 26.

Figure 8B:
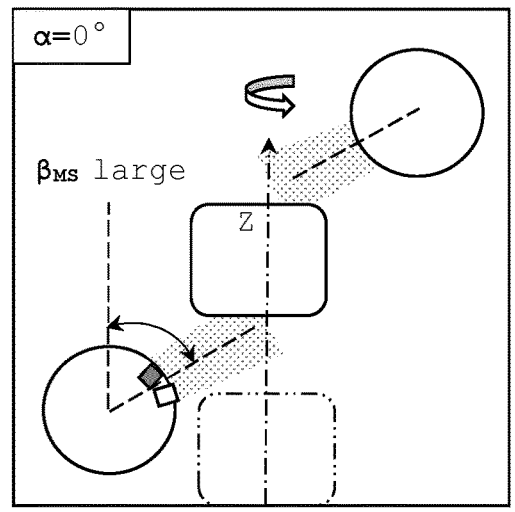

FIGS. 8A and 8B show a vertical section of a movement and positioning scheme of the magnetic system during a deposition process, showing in FIG. 8A a β-position of the magnetic systems 6 and the respective sputter cone 16 whereby side surfaces $S_v$ of the short object side b, which is in parallel to the target axes $Y_1$, $Y_2$, can be coated while the object is in an $\alpha=90°$ position according to horizontal section scheme in FIG. 10B. Depending on the actual substrate dimensions β-values from 30° to 85°, or 45° to 80° might be applied. Higher β-values from 85° to 90° may be used for a "maximum position" where a maximal, e.g. a horizontal dimension in an object plane $O_x$ is positioned between the projection of target axes $Y_1$, $Y_2$, on plane O or $O_x$. In case of a cuboid with a rectangular basis a, b the maximum dimension is a diagonal with dimension d1 as shown above and in horizontal section FIG. 10C.

With FIG. 8B a β-position is shown which allows to coat surface areas $S_h$ in planes O' an O", here upper and lower surface areas, while the object is in an $\alpha=0°$ position with the long side a in parallel to the target axes $Y_1$, $Y_2$, in accordance with horizontal section in FIG. 10A. Depending on the actual substrate dimensions β-values from 40° to 90°, or 45° to 80° might be applied.

For simple rotational geometries as discussed above and moderate substrate rotation speeds swiveling of the magnetic system may be synchronized with the rotation of the substrate holder and the respective circumferential geometry of the object(s) on the holder, so that the sputter cone follow at least approximately the respective surface area to be coated. Such a swivel curve showing the dependency of position angle β from object rotation angle α is shown in FIG. 12. In this case however for medium and near distance positions of the substrate side surfaces $S_v$, see FIGS. 10B and 10C, the same position is used to avoid to many reverse turns of the magnetic system.

In case of higher substrate rotation, e.g. equal or higher 0.2 or 0.5 rounds per second however, due to the inertia of the magnetic system another principle should be applied to avoid mechanical overload of the system. Therefore, as mentioned above, the magnet is swiveled to a defined β-position and stationary hold at the position for a certain number of substrate rotations and then moved to at least one, but usually to further, e.g. 3 to 6 different β-positions to produce a good coating distribution on the 3D-object. It has to be noted that different β-positions may be applied with the same of different coating time, i.e. same or different number of rotations, depending on the geometric details of the object.

Figure 9B:
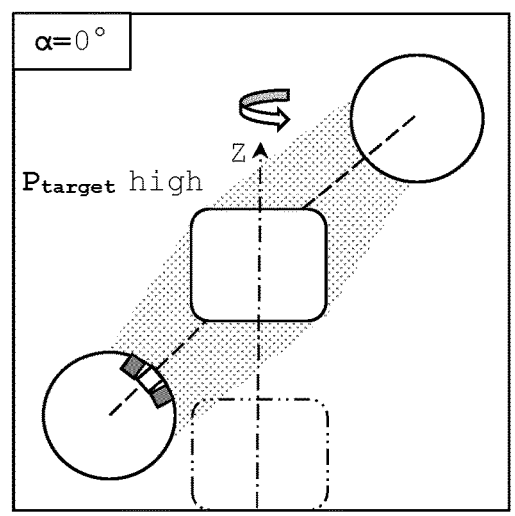

FIGS. 9A and 9B show similar vertical schemes as in FIGS. 8A and 8B, however directed to the power modulation during substrate rotation of a cuboid object. In contrast to FIGS. 8A and 8B a magnetic system comprising three lines of alternatively opposite magnetic orientation, thereby two parallel racetracks and a respective broader overlapping sputter cone can be produced allowing to use a smaller over all position angle, but at the same time loosing adjustment precision of the cone.

With FIG. 9A again an α=90° position of the 3D-object is shown according to horizontal scheme in FIG. 10B. As the object, here with its smaller side b, is in a "medium" position compared to the "far distance" position in FIG. 10A and the "near distance" position in FIG. 10C, a medium target power can be applied.

With FIG. 9B again an α=0° position of the 3D-object is shown according to horizontal scheme in FIG. 10A, which is a far position. Therefore, a high power is applied to the targets. In FIG. 10C a respective near distance position is shown with a low target power applied.

A complete power curve which can be used to synchronize the power of targets 3, 4 with the rotation angle α of a cuboid 3D-object is shown in FIG. 11, showing different target power in dependency of the, in this case symmetric object geometry having near distance or diagonal edge positions at 64°, 116°, 244°, 296, whereas there are only two medium and two far distance positions referring to the respective parallel edge positions as shown in FIGS. 10A and 10B. Alternative curves, e.g. in sinus or cosinus type modulation could be applied obviously too.

As could be shown hereby power synchronization can be more easily applied and more finely tuned to any object geometry, compare also curves of FIG. 11 and FIG. 12, or alternatives with fixed β-position for one or several object rotations as discussed above.

Figure 13:
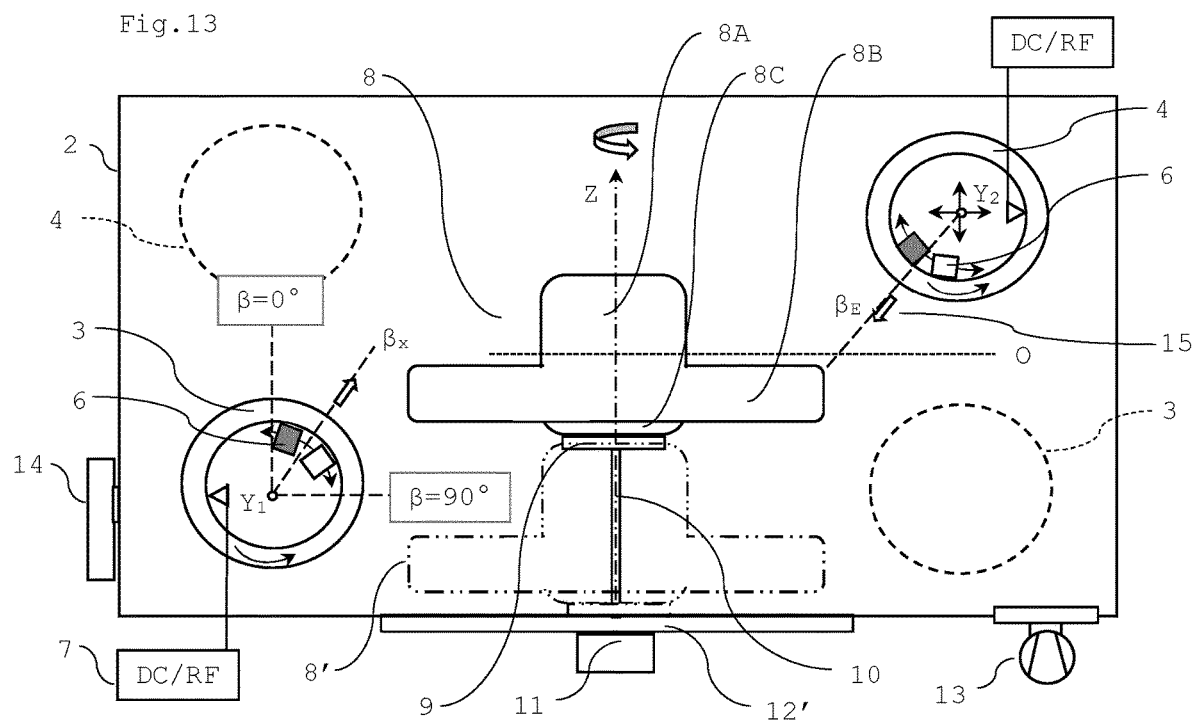
Figure 14:
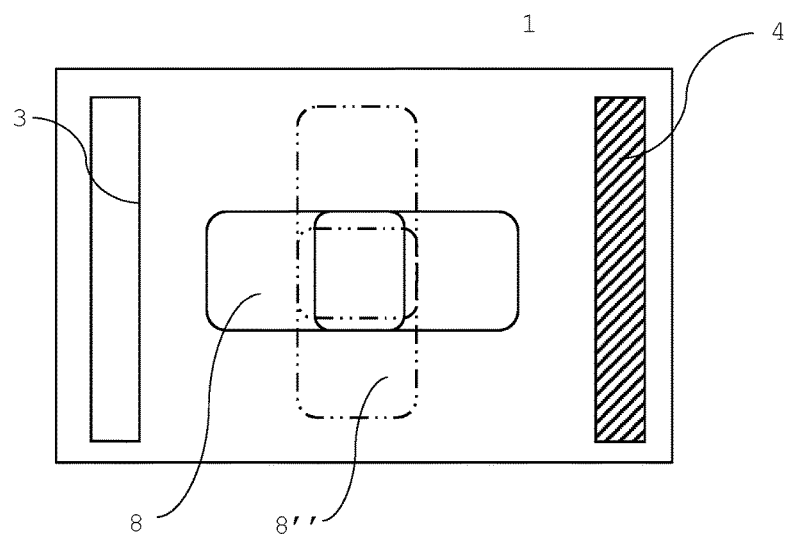

The coating chamber in FIG. 13 has the same geometry and target arrangement as coating chambers shown in FIGS. 4 and 7, however a 3D-object 8 of different, more complex geometry, which is asymmetric with reference to the object plane O, is mounted to the pedestal type holder 9. The object comprising a cuboid middle body 8B, a higher but smaller upper cuboid part 8A, and a flat and smaller lower cuboid part 8C. A horizontal scheme of the body mounted in parallel 8" (dash double dotted lines) and in a 90° rotated position 8' (solid lines) to the targets 3, 4 can be seen in FIG. 14. In such a constellation, magnetic systems 6 can be pivoted with different angular velocity and/or can be set to different β angels during the deposition process to provide a uniform coating distribution. Alternatively, or in addition targets 3, 4 can be driven with different power modulation curves from their dedicated power supplies 7. Furthermore FIG. 13 displays an angel $β_E$ directed directly to the edge of the 3D-object. Thereby it can be seen that there will be a second, different $β_E$ for the upper magnetic mechanism 6 when it swivels to the upper edge of the present 3D-object 8 which leeds to the terminal surface of sector 8A. With targets 3, 4 in dotted lines a coating chamber is shown comprising two pairs of targets 3, 4 if a higher coating speed should be envisaged. Such target pairs with targets 3, 4 positioned on the same side of the holder, i.e. on the same side of the holder axis Z, can be used for any configuration, for instance with FIG. 4 or 13 with targets 3, 4 on the same side of the holder only, instead of the opposed target position as shown, to have the coating chamber and vacuum volume as small as possible. Or as a further example analog to FIG. 4 but with respective superposed target pairs 3, 4 in the position of the single targets 3, 4 as shown, when a high-rate deposition and/or higher coating thicknesses should be sought. Respective target pairs with targets 3, 4 positioned on the same side of the holder can be also foreseen with FIGS. 8 to 10 and FIGS. 15A, 15B.

Figure 15A:
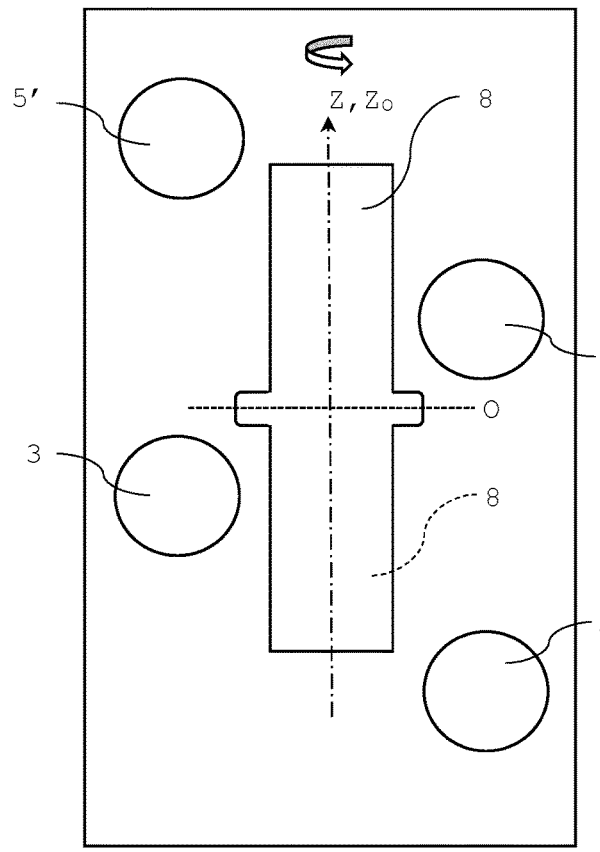
Figure 15B:
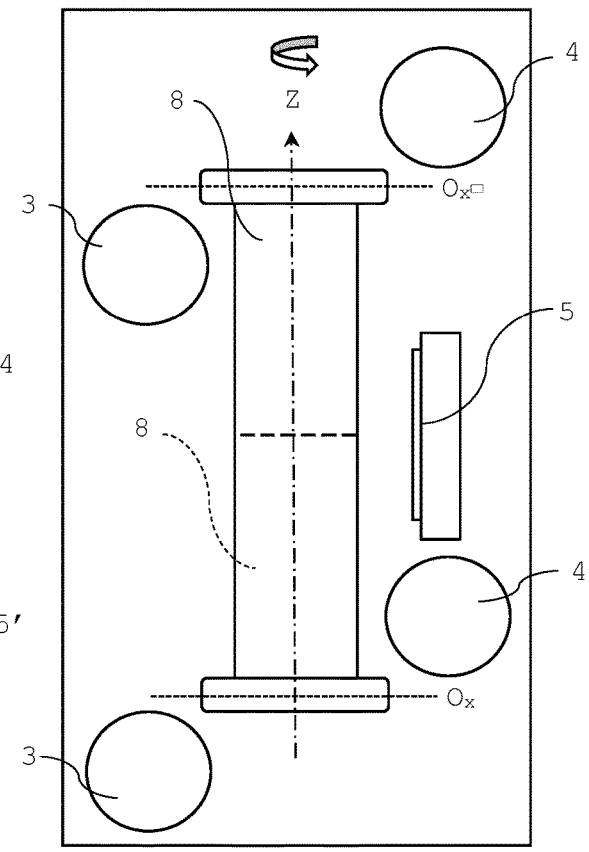
Figure 16:
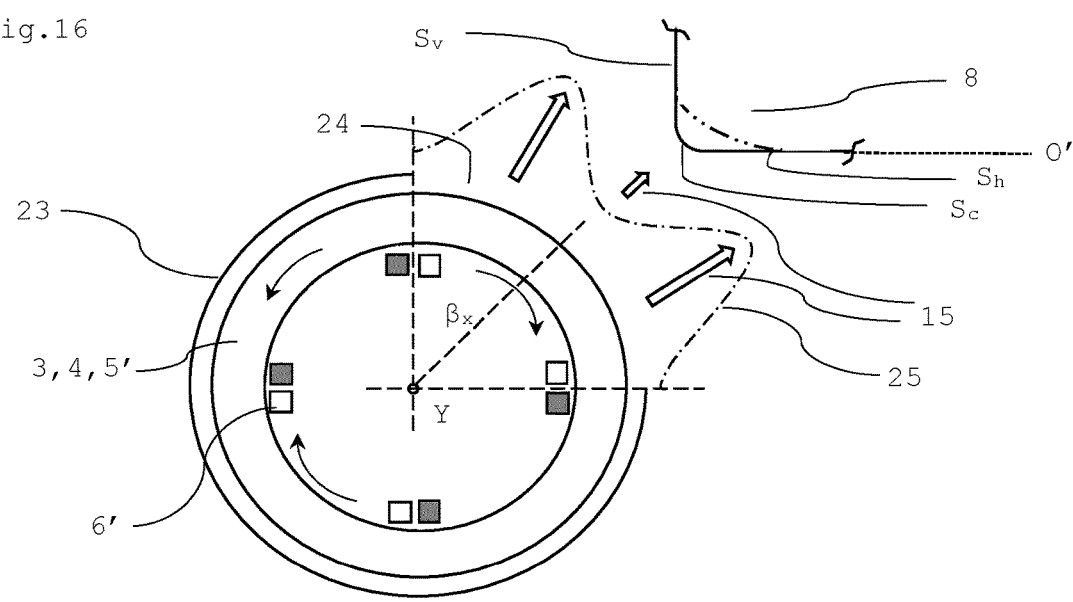

FIGS. 15A and B show further embodiments of the present invention which can be applied for elongated 3D objects 8 which may be cylindric, prismatic or of any other shape. The object 8 in FIG. 15A comprises one pronounced circumferential protrusion 8" in a central object plane O, whereas the object 8, respectively the objects, as symbolized by dashed reference and separation line between the objects 8, in FIG. 15B has respectively have two protrusions 8" in planes $O_x$ in lateral regions. Symmetrically to the respective protrusions 8" rotary targets 3 and 4 are mounted according to one of the embodiments as discussed above. Additionally, further rotary targets 5' are mounted as shown in FIG. 15A above respectively below the edge region to provide a uniform coating there and on the terminal surfaces $S_h$ traverse to axis Z. In FIG. 15B a further planar sputter target 5 is mounted to provide a uniform coating on the long shaft between the two object protrusions 8". In both figures the vertical object axis Zo again is aligned with rotation axis Z of the holder.

FIG. 16 shows a target arrangement which could be used for all inventive embodiments, using instead of one swivel mounted magnetic system 6 per target, four rotating magnetic systems 6 each offset by 90° from the next system with reference to the inner target diameter. All magnetic systems 6 rotate clockwise at the same rotational speed against the rotation of the rotating target 3, 4, 5', round target axis Y. The respective four magnetic system configuration ensures that plasma never extinguishes in the active quarter of the rotating cathode where the target surface lies open, whereas the rest of the surface is covered with a dark room shield 23, which can be set on ground potential to provide the anode of the rotary cathode, or alternatively is electrically isolated and on floating potential.

When using a wider angle of the dark room shield aperture 24 a system with three or two equidistantly positioned magnetic systems would suffice, e.g. for an aperture of 120° respectively 180°. Otherwise for less productive systems even one rotating system 6' may suffice and plasma is reignited each time the magnetic system starts to pass under the open target surface in the aperture area.

At the same time when the magnetic system 6' passes under the aperture 24 power may be modulated according to power graph 25 as shown in the dash dotted curve above the respective target surface. Therewith power can be set low when the magnetic system passes or stands in a $\beta_x$ position of about 45°, opposite to the near surface area $S_c$ of a circumferential edge, protrusion or similar of the rotated 3D-object 8. Therewith the particle flow as symbolized by short arrow 15 will be smaller than inside surface areas $S_h$, $S_v$ further away from the target surface when the racetrack passes an angle of about 30° or 60°, which is symbolized by longer particle flow arrows 15. Therewith a more uniform coating distribution between edge or protrusion areas and side areas of the 3D-object can be reached and even small differences or asymmetries in edge convexity as exemplarily shown in dash double dotted lines can be taken into account.

Respective power curves as shown and discussed at the hand of FIG. 16 can be also applied and adapted to swivel mounted targets of the same or different swivel range. So can darkroom shields be used with all types of rotary cathodes to better define the counter electrode.

Finally, it should be mentioned that a combination of features mentioned with one embodiment, examples or types of the present invention can be combined with any other embodiment, example, or type of the invention unless being obviously in contradiction.

Several tests and experiments have been performed with a Solaris S115 multi-chamber system from Evatec AG, one process chamber having been adapted with two cathodes using targets of the same target material for one deposition process. Chamber volume was about 60 liters, targets of 300 mm length and an outer diameter from 105 to 110 mm have been used. The targets could be aligned in a horizontal plane towards axis Z according to the respective substrate dimensions, the upper target could be aligned also in a z-direction. Preprocessing steps (degassing, etching, adhesion layer) have been performed in separate chambers when necessary. 3D-objects of cylindric or cuboid shape of the following dimensions have been coated:

Cylindric shape: Diameter from 50 to 200 mm, height from 5 to 20 mm each having one circumferential protrusion from 5 to 20 mm projecting from the sidewall(s) of the 3D-object, or at least one circumferential convex edge between vertical sidewall(s) and horizontal terminal surfaces have been foreseen. Edge radius for the convex edge was 3, 8, and 15 mm. Protrusions had a square or a convex semi-circular shape.

Cuboid shape: base dimensions a/b from 1 to 3, with side a varying from 50 to 200 mm, height from 5 to 20 mm; protrusions respectively edges as mentioned with cylinder.

As target material aluminum, chromium, titanium has been used in inert and reactive gas atmosphere. Respective process parameters are shown in table 1 below. Coating uniformities between 5 to 15 percent could be achieved for all surfaces of the 3D-body. Even better uniformities could be reached for sidewall and convex edge, respectively protrusion surfaces alone.

TABLE 1

| Process parameters: | Example | Unit | Range 1 | Range 2 | Range 3 |
|---|---|---|---|---|---|
| Argon gas flow: | 8 | sccm | 0-60 | 0-140 | 0-12 |
| Nitrogen gas flow: | 16 | sccm | 10-120 | 0-100 | 0-25 |
| Chuck gas flow: | 3 | sccm | 0-20 | no | 2-6 |
| Chuck gas pressure: | 4 | mbar | 0-20 | no | 3-8 |
| Process gas pressure: | 3.00E−03 | mbar | 5e−2-5e−4 | 5e−2-5e−4 | 1e−3-5e−3 |
| pulsed DC power Al, Cr, Ti | 1000 | W | 100-10000 | 100-10000 | 400-1600 |
| Target object distance: | 45 | mm | 10-80 |  | 40-50 |

REFERENCE NUMBERS 1,1' sputtering apparatus
2,2' coating chamber
3 lower rotary target
4 upper rotary target
5 target
5' further rotary target
6 swivel mounted magnetic system
6' rotatable mounted magnetic system
7 power supply
7' bipolar pulsed power supply
8 3D object
8' 3D object in load position
8" protrusion
8'" recess
9,9',9'" object holder (pedestal type, internal, screwed, . . . )
10 holder post
11 holder drive
12 chamber port
12' closure of the chamber port
13 pumping system
14 control system
15 particle flow (symbolized)
16 plasma cone (symbolized)
17 carrousel
18 inner circumference of a hollow object
19 bias supply (DC, RF)
20 holder lifter for holder movement in Z-direction
21 alignment mechanism for target axis
22 inscribed diameter
23 darkroom shield
24 aperture
25 power graph
26 inlet inert gas
27 inlet reactive gas
28 vacuum or pumping port
α angel of the holder/object rotation (0° and 180°=parallel to targets);
β, $\beta_x$ position angel of the magnetic system $\beta_x$=0° when in parallel to axis Z; $\beta_x$=90° when vertical to axis Z);
$\beta_E$ $\beta_x$ when directed directly to the edge protrusion, recess
ω angular velocity of angle β
BL angle bisector line of object edge
$O_x$ object plane
O object plane (see definition);
O' first terminal (lower) object plane O" second terminal (upper) object plane
P sputter power
$S_c$ convex surface comprising sub sectors I and II
$S_h$ surface in parallel ±45°, preferably ±30° deviation to object plane, e.g. in O', O";
$S_v$ surface in a right angle ±45° to O, preferably ±30° deviation from right angle to object plane;
$Y_{1,2}$ target axis
Z holder axis=object axis
Z' carrousel axis
Z" satellite axis
↑↔ movement arrows, magnetic system, target axis, substrate holder.

What is claimed is:

1. An apparatus to coat at least one three-dimensional (3D) object on a surface by physical vapor deposition, the apparatus comprising:
   a coating chamber;
   a vacuum pump system connected to the chamber by a vacuum port;
   a chamber port;
   a rotatable object holder, the holder having a rotational axis Z, and an object axis of the at least one 3D-object to be mounted corresponds to the holder axis Z;
   at least two rotary cathodes positioned in the chamber, the cathodes each comprising a hollow cylindrical rotary target having a rotary axis Y;
   a plurality of magnetic systems which are swivel or rotary mounted round axis Y and positioned neighboring to an inner diameter surface of each of the targets;
   at least one power supply for the target;
   wherein the targets of the at least two rotary cathodes are positioned round the holder, with their axes $Y_1$, $Y_2$ transverse to axis Z, both being offset to the holder in a z-direction, and being offset to each other in a direction along axis Z on opposite sides of an object plane O, O', O" which is vertical to axis Z, and the holder is movable along axis Z to position the object plane O, O', O" in or near the center of a circumferential edge, protrusion, or recess of the 3D-object to be coated, and
   wherein the apparatus comprises a magnet controller being designed to control a position angle β or/and a swivel frequency f of the magnetic systems in dependency of a number m of holder turns round axis Z, where m is an integer, to set the position angle β of the magnetic systems of the targets to another in dependency of the shape of the at least one object to be mounted on the holder and sweep or position a center of a sputter cone in an angle Bx from 0° to 90° or smaller to deposit a coating on the surface of the at least one 3D-object to be mounted.

2. The apparatus according to claim 1, wherein axes $Y_1$, $Y_2$ of the targets are in a right angle to axis Z.

3. The apparatus according to claim 1, wherein axes $Y_1$, $Y_2$ of the targets are both horizontal.

4. The apparatus according to claim 1, wherein the holder is mounted on the closure of the chamber port.

5. The apparatus according to claim 1, wherein the chamber port is mounted in a bottom area of the chamber.

6. The apparatus according to claim 1, comprising at least one further rotary cathode, positioned above or below the at least two rotary cathodes.

7. The apparatus according to claim 1, comprising at least one planar magnetron, positioned above or below the at least two rotary cathodes.

8. The apparatus according to claim 1, wherein targets are positioned on the same side of the holder.

9. The apparatus according to claim 1, wherein targets are positioned on opposite sides of the holder.

10. The apparatus according to claim 1, comprising 2n targets wherein n is an integer.

11. The apparatus according to claim 1, wherein the at last one target on one side of plane O, O', O" and the at last one target on the other side of plane O, O', O" each have a separate power supply.

12. The apparatus according to claim 1, wherein at last one target on one side of plane O, O', O" and at last one target positioned next on the other side of plane O, O', O" is connected to a bipolar power supply in dual magnetron configuration.

13. The apparatus according to claim 1, comprising a control system with a power modulator adapted to set and control the power of the at least one power supply and a magnet controller adapted to set and control movement and position of the magnetic system.

14. A process to deposit a coating on a surface of at least one 3D-object using an apparatus according to claim 1 and comprising the following steps:
   mounting the at least one 3D-object on the holder;
   transferring the holder with the 3D-object into the coating chamber;
   applying vacuum to the chamber by opening the vacuum port;
   setting a gas flow of inert gas and setting optionally a gas flow of a reactive gas;
   optionally applying a substrate bias to the 3D-object;
   connecting the targets to a power supply to sputter material from the targets towards the surface.

15. The process according to claim 14, wherein a target power P of at least one of the targets is synchronized by a power modulator with at least one of the following process features:
   a rotation angle α of the holder round axis Z,
   a position angle β of the magnetic system,
   a swivel frequency f of the magnetic system,
   an angular velocity ω of the magnetic system.

16. The process according to claim 14, wherein the magnetic systems of the targets are swivel mounted, and a magnet controller controls the position angle β or/and a swivel frequency f of each of the magnetic systems in dependency of a rotation angle α of the holder round axis Z.

17. The process according to claim 14, wherein a position angle β of the magnetic system is set in a range from ±0° towards plane O, O', O" to ±90° towards axis Z or smaller.

18. The process according to claim 14, wherein the magnetic systems are rotary mounted, and a magnet controller controls an angular velocity ω of the magnetic system in dependency of a number m of turns of the holder, where m is an integer, or in dependency of a rotation angle α of the holder round axis Z.

19. The process according to claim 14, wherein an object to be coated has a long Z-Axis and is of a cylindric, or prismatic, or cuboid shape.

20. The process according to claim 14, wherein the object to be coated is a flat body having two horizontal axes A, B of essentially different length in a relation of 10/12 to 10/40, and a thickness in a relation of 1 to 150 to one of horizontal axes A, B.

21. A process to deposit a coating on a surface of at least one 3D-object comprising the following steps:
   providing an apparatus comprising:
       a coating chamber;

a vacuum pump system connected to the chamber by a vacuum port;

a chamber port;

a rotatable object holder, the holder having a rotational axis Z;

at least one rotary cathode positioned in the chamber, the cathode comprising a plurality of hollow cylindrical rotary targets having a rotary axis Y;

a plurality of magnetic systems which are swivel or rotary mounted round axis Y and positioned neighboring to an inner diameter surface of each of the targets;

at least one power supply for the target;

the target of the rotary cathode being positioned with axis Y1, Y2 in a target plane T', T", the target plane being perpendicular to axis Z, both targets being offset to the holder and to each other in a z-direction, on opposite sides of an object plane O, O', O" which is vertical to the axis Z, and the rotary cathode(s) being positioned in a distance D from rotary axis Z;

mounting the at least one 3D-object on the rotatable holder;

transferring the holder with the 3D-object into the coating chamber; and positioning at least one object plane O, O', O" comprising an essentially circumferential edge, protrusion or recess in a distance to a target plane T', T" to allow sputtering in an angle $\beta_E$ to the edge, protrusion or recess;

applying vacuum to the chamber by opening the vacuum port;

setting a gas flow of an inert gas and setting optionally a gas flow of a reactive gas;

optionally applying a substrate bias to the 3D-object;

rotating the 3D-object;

connecting the targets to a power supply to sputter material from the targets towards the surface; and swiveling or rotating the magnetic system to sweep or position a center of a sputter cone in an angle $\beta_x$ from 0° to 90° or smaller, wherein a magnet controller controls a position angle $\beta$ or/and a swivel frequency f of each of the magnetic systems in dependency of a number n of holder turns round axis z, where m is an integer, to set the position angle $\beta$ of the magnetic systems of the targets to another in dependency of the shape of the 3D-object mounted on the holder.

* * * * *